United States Patent
Brintzinger et al.

(10) Patent No.: US 7,172,966 B2
(45) Date of Patent: Feb. 6, 2007

(54) METHOD FOR FABRICATING METALLIC INTERCONNECTS ON ELECTRONIC COMPONENTS

(75) Inventors: Axel Brintzinger, Dresden (DE); Octavio Trovarelli, Dresden (DE); Wolfgang Leiberg, Dresden (DE)

(73) Assignee: Infineon Technologies AG, Munich (DE)

(*) Notice: Subject to any disclaimer, the term of this patent is extended or adjusted under 35 U.S.C. 154(b) by 188 days.

(21) Appl. No.: 11/046,663

(22) Filed: Jan. 28, 2005

(65) Prior Publication Data

US 2005/0186786 A1    Aug. 25, 2005

(30) Foreign Application Priority Data

Jan. 30, 2004  (DE) .................... 10 2004 005 022

(51) Int. Cl.
  *H01L 21/44* (2006.01)
(52) U.S. Cl. .................. 438/672; 438/598; 438/637; 438/641; 438/668; 438/675; 438/687
(58) Field of Classification Search ................ 438/598, 438/637, 641, 668, 672, 675, 687
  See application file for complete search history.

(56) References Cited

U.S. PATENT DOCUMENTS

| 4,861,425 | A | 8/1989 | Greet et al. |
| 6,869,879 | B1 * | 3/2005 | Ryan ........................... 438/689 |
| 2003/0092274 | A1 | 5/2003 | Brintzinger |
| 2003/0183530 | A1 * | 10/2003 | Chou et al. ................. 205/157 |
| 2005/0007217 | A1 * | 1/2005 | Deligianni et al. ........... 335/78 |
| 2006/0118425 | A1 * | 6/2006 | Basol et al. ................. 205/125 |

FOREIGN PATENT DOCUMENTS

DE    101 56 054 C2    11/2003

* cited by examiner

*Primary Examiner*—Matthew Smith
*Assistant Examiner*—Thanh V. Pham
(74) *Attorney, Agent, or Firm*—Slater & Matsil, L.L.P.

(57) ABSTRACT

The invention, which relates to a method for fabricating metallic interconnects with copper-nickel-gold layer construction on electronic components, is based on the object of specifying a method by means of which it is possible to fabricate such metallic interconnects on different electronic components cost-effectively by means of the known and tried and tested methods which have a comprehensive corrosion protection. According to the invention, the object is achieved by virtue of the fact that the interconnects are embodied such that they are completely encapsulated by being deposited in a manner buried in a patterned dielectric layer in the lower region and being covered in the upper region by a nickel-gold layer adjoining the lower encapsulation without any gaps.

20 Claims, 2 Drawing Sheets

METHOD FOR FABRICATING METALLIC INTERCONNECTS ON ELECTRONIC COMPONENTS

This application claims priority to German Patent Application 10 2004 005 022.8, which was filed Jan. 30, 2004, and is incorporated herein by reference.

TECHNICAL FIELD

The invention relates to a method for fabricating metallic interconnects with copper-nickel-gold layer construction on electronic components, the copper core of the interconnects being electrodeposited on a copper seed layer with a diffusion barrier arranged underneath and being covered by a nickel-gold layer by means of a resist mask made of positive resist.

BACKGROUND

Metallic interconnects arranged in a plane serve, as is known, particularly for the rewiring of the contact areas (contact pads) of a component to the connection contacts, which are arranged on the surface of the component and which, in various applications, are also embodied as contact areas and with the aid of which the component is integrated into an electronic circuit. These arrangements are increasingly gaining in importance for wafer level packages or chip size packages, which are produced in the wafer assemblage and prior to singulation, for the customary, subsequent mounting processes, all require rewiring, protective passivation (BCB) and connection contacts simultaneously. In order to meet the constant demand for ever smaller component dimensions, these components do not have housings, but rather at most protective passivation or plastic layers, so that their dimensions correspond precisely or almost to those of the integrated circuit (chip) contained.

The interconnects and also the electrical contact areas adjoining the interconnects are fabricated by a first positive resist being patterned lithographically on a device surface having a copper seed layer, so that the resist mask images the structure of the interconnect structure to be fabricated. The copper core of the interconnects is electrodeposited in this mask structure and the resist mask is subsequently removed.

There is essentially no separate protection provided for the interconnects. However, since the interconnects have shown signs of corrosion after reliability tests, for example the ultrashort time tests (HAST), the copper track serving as the actual electrical conductor is encapsulated by a nickel-gold layer. The nickel-gold layer comprises a nickel layer and a gold layer and is deposited, preferably sputtered, on the copper core using a second resist mask. This layered construction of an interconnect using copper as the electrical conductor is preferred, as is known, since copper has the best electrical conductivity and gold is outstandingly suitable as a contact area, while nickel principally serves as a diffusion barrier between the two materials.

It has been established, however, that the copper core of the interconnects forms an overhang region at its sidewalls on account of the sidewall form of the openings of the first resist mask after the removal thereof, in which overhang regions a residue of the resist, which is formed as a positive resist, remains after the development thereof, and that this resist residue may again be the cause of corrosion, of so-called popcorning, in which the interconnect is damaged by evaporation of water present in the resist residue during a thermal process, or of contamination of the component.

SUMMARY OF THE INVENTION

Consequently, the invention is based on the object of specifying a method by means of which metallic interconnects can be fabricated on different electronic components cost-effectively by means of the known and tried and tested methods which have corrosion protection, so that the disadvantages presented above are avoided.

According to a preferred embodiment of the invention, the object is achieved by means of a method for fabricating metallic interconnects with copper-nickel-gold layer construction on electronic components. The copper core of the interconnects are electrodeposited on a copper see layer with a diffusion barrier arranged underneath and are covered by a nickel-gold layer by means of a resist mask made of a positive resist.

The preferred embodiment of this invention is essentially based on the concept that the interconnects are buried, as it were, in the dielectric layer present on the surface of the component. For this purpose, it is necessary firstly for the interconnect structure to be transferred into the dielectric and then for the diffusion barrier and the copper seed layer to be applied in a manner covering this structure. The copper seed layer thus has a trough-type cross section in the region of the interconnects and, in connection with the resist mask that is subsequently to be fabricated, is the basis for the electrodeposition of the copper core of the interconnects.

The second, upper part of the encapsulation is formed by the known nickel-gold layer, which is applied to the copper core and likewise comprises two layers, the nickel layer and the gold layer. By virtue of the fact that the resist mask is patterned lithographically a second time with a further lithography mask prior to the copper core being plated with the nickel-gold layer, a strip of the copper seed layer is then uncovered beside the copper core of the interconnects. This strip is adjoined by the nickel layer, which thus encapsulates the copper core in the region that is still uncovered. The width of the nickel layer in this region will also form in accordance with the width of the strip of the copper seed layer that is uncovered beside the copper core. In this case, the width of the strip is exclusively determined by the structure of the further lithography mask used for the invention's second lithographic patterning of the resist mask.

It is thus ensured that the interconnects are completely surrounded by protective material, the dielectric in the lower region and the nickel-gold layer in the upper region. Since the dielectric layer is likewise patterned lithographically, the copper core, in this method too, has such a cross section which encompasses lateral, overhanging regions. However, by virtue of the dielectric mask remaining on the component surface, this overhang region is not uncovered at any time, so that contaminating or corroding deposits are completely prevented there.

This complete encapsulation of the copper core in addition to the fact that it prevents corrosion as a result of encapsulating the copper core, has the advantage that the resist mask that is then still present laterally with respect to the interconnect can be stripped before the then uncovered copper seed layer and diffusion barrier are etched.

Depending on the component embodiment, the dielectric mask in turn may be fabricated in a dielectric layer that is already present on the component, for example as a protective passivation layer, or in a dielectric layer that is to be applied separately.

Moreover, a method for fabrication of the interconnects may also include the fabrication of the contact areas provided that they have the same layer construction.

In accordance with particular embodiments of the invention, the copper seed layer has a thickness in the range of approximately 120 to 180 nm, and preferably of 150 nm. On the one hand, this thickness has proved to be sufficient for the seed layer for the electrodeposition of the copper core. On the other hand, the end region of the copper seed layer that is uncovered after the stripping of the resist mask and the etching of the copper seed layer and diffusion barrier is thus so small that adequate copper-nickel-gold transitions acting as an electrolytic element are not present even in a moist medium, for example during a reliability test.

Since the resist mask is to be applied on the dielectric mask and in a manner corresponding to the mask openings thereof, a particularly advantageous embodiment of the invention provides for the structure of the resist mask to correspond to the structure of the dielectric mask. This leads to a partial superposition of the sidewalls of the mask openings in the upper region of the dielectric mask and, consequently, to the sidewalls becoming steeper in this region, which promotes the complete removal of the resist mask.

The matching structures of the first and second resist mask thus enable both resists to be patterned lithographically with a dielectric mask.

By virtue of the diffusion barrier comprising nickel in accordance with a specific embodiment of the invention, there is a highly effective diffusion barrier present between the copper of the interconnect and the electronic component and also in the sidewall region of the dielectric mask and the copper. At the same time, the nickel may also serve as an etching barrier for the copper seed layer in a subsequent standard etching step.

In order to fabricate the diffusion barrier and the copper seed layer, a different advantageous inventive configuration provides for the two layers to be sputtered. A tried and tested method step is thus employed by means of which it is possible to fabricate precise thin layers that can be differentiated, which is particularly advantageous in order to produce the preferred embodiment of the invention's complete encapsulation of the copper core of the interconnects and the desired thickness of the copper seed layer.

For the application of the method in wafer level package technology, the electronic component, as described, is a semiconductor component which, in this specific application, is still situated in the wafer assemblage and is provided, in this production phase, with the contact areas and interconnects serving for rewiring. It is also equally possible however, for the electronic component to be a semiconductor component that has already been singulated or a polymer component, depending on where and under what requirements such interconnects and contact areas are needed.

BRIEF DESCRIPTION OF THE DRAWINGS

The invention will be explained in more detail below on the basis of an exemplary embodiment. In the associated drawing.

The following list of reference symbols can be used in conjunction with the figures

| 1 | Electronic component |
| 2 | Interconnect |
| 3 | Copper core |
| 4 | Copper seed layer |
| 5 | Nickel-gold layer |
| 6 | Sidewalls |
| 7 | Overhang |
| 8 | Resist residue |
| 9 | Dielectric mask |
| 10 | Diffusion barrier |
| 11 | Resist mask |
| 12 | Nickel layer |
| 13 | Gold layer |

DETAILED DESCRIPTION OF ILLUSTRATIVE EMBODIMENTS

Figure 1:
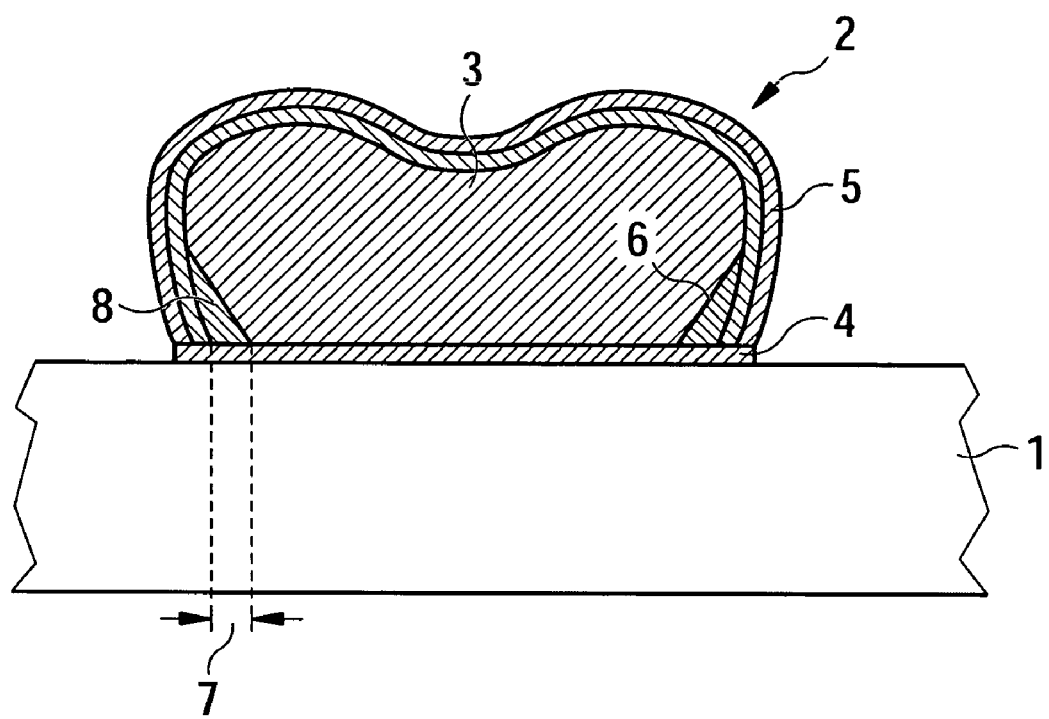
FIG. 1 shows a diagrammatic sectional illustration through an interconnect in accordance with the prior art.

FIG. 1 illustrates an electronic component 1, a semiconductor in the exemplary embodiment, on which an interconnect 2 is applied. The interconnect 2 comprises a copper core 3 which is arranged on a copper seed layer 4 and is otherwise encapsulated by a nickel-gold layer 5.

The copper core 3 has an overhang 7 at its lateral sidewalls 6, the overhang being filled by a resist residue 8. This resist residue 8 is a residue of the positive resist mask, which is removed by photographic development, as is known, and, on account of its hygroscopic properties, causes faults in reliability tests which take place under moist ambient conditions.

By contrast, FIGS. 2a to 2e diagrammatically represent method steps according to the preferred embodiment of the invention for fabricating a completely encapsulated interconnect 2.

Figure 2A:
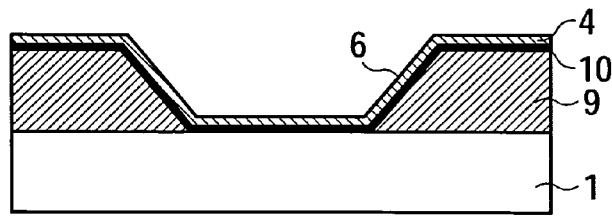
FIG. 2 shows a diagrammatic illustration of the method steps according to the invention.

FIG. 2a illustrates an electronic semiconductor component 1 provided with a dielectric mask 9. In this exemplary embodiment, the dielectric mask 9 is fabricated from a dielectric (WRP) which is applied in a manner dissolved in water and is patterned lithographically after it has been cured, so that the dielectric mask 9 has openings wherever interconnects 2 and possibly also contact areas are to be fabricated. In a manner areally covering the surface of the dielectric mask 9 and the opening thereof, the diffusion barrier 10 made of titanium and subsequently the copper seed layer 4 having a thickness of 150 nm are applied by sputtering. In this case, the thickness of the diffusion barrier 10 has to be sufficient to ensure a low contact resistance and high corrosion protection.

Figure 2B:
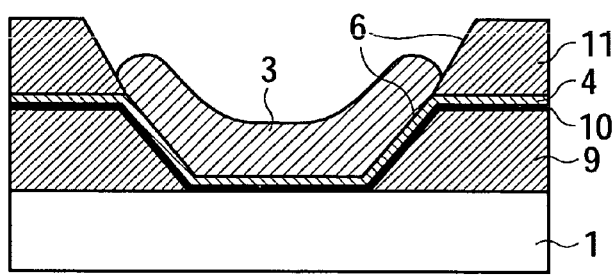

The electronic semiconductor component 1 in FIG. 2b already has the resist mask 11, which is electrodeposited on the copper seed layer 4 and patterned lithographically, the illustrated opening of the resist mask 11 having the same size and position as the opening of the dielectric mask 9. Only the sidewalls 6 of the openings of the dielectric mask 9 and resist mask 11, which lie one above the other, exhibit different inclinations. The copper core 3 of the interconnect 2 is applied by electrodeposition into the opening formed by the dielectric mask 9 and the overlying resist mask 11, the copper core exhibiting a well-like cross section owing to the sidewalls 6.

Figure 2C:
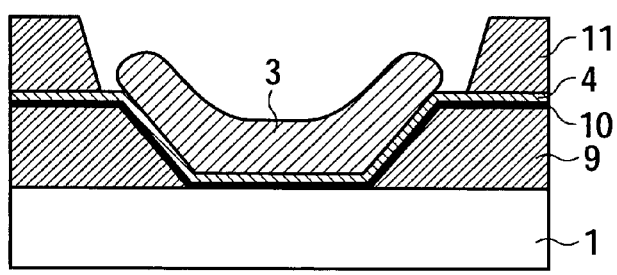

The state of the electronic semiconductor component 1 after the subsequent, second lithographic patterning of the resist mask 11 by means of a second lithography mask, which has widened interconnect structures relative to the first lithography mask for the first patterning of the resist mask 11, can be seen in FIG. 2c. Owing to the deviating mask openings of the two lithography masks, a strip of the copper seed layer 4 is not covered by the resist beside the copper core 3.

Figure 2D:
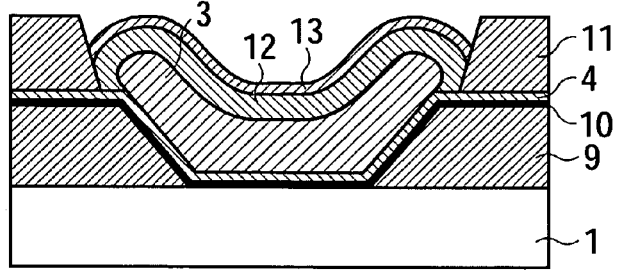

Afterwards, the copper core 3 is successively plated with nickel and gold. In this case, the nickel layer 12 adjoins the uncovered copper seed layer 4 without any gaps and closes the strip as far as the resist mask 11. The gold layer 13 deposited on the nickel layer 12 closes, as it were, the opening of the resist mask 11 towards the top, so that, as can be seen in FIG. 2*d*, the copper core 3 is completely encapsulated by these two layer systems in the region which is not enclosed by the dielectric mask 9.

Figure 2E:
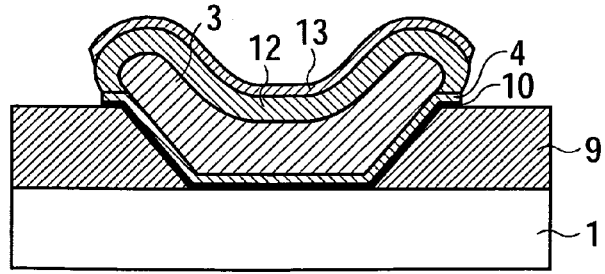

After the encapsulation of the copper core 3, the resist mask 11 is stripped, as a result of which the resist mask is completely removed, and the copper seed layer 4 and the diffusion barrier 10 are subsequently etched (FIG. 2*e*).

What is claimed is:

1. A method of forming interconnects over an electronic component, the method comprising:
   providing an electronic component having contact areas overlying a surface thereof;
   forming a dielectric mask over the surface of the electronic component, the dielectric mask exposing portions of the surface of the electronic component;
   forming a first conductive layer over the dielectric mask and over the exposed portions of the surface of the electronic component;
   forming a resist mask over the first conductive layer, the resist mask including opening exposed portions of the first conductive layer over the exposed portions of the surface of the electronic component;
   selectively forming a conductor over the exposed portions of the first conductive layer;
   widening the openings in the resist mask;
   forming a second conductive layer over the conductor;
   removing the resist mask; and
   removing portions of the first conductive layer over the dielectric mask.

2. The method of claim 1 wherein the first conductive layer comprises a copper seed layer and wherein selectively forming a conductor comprises electroplating copper.

3. The method of claim 2 and further comprising forming a diffusion barrier over the dielectric mask and over the exposed portions of the surface of the electronic component, wherein the first conductive layer is formed over the diffusion barrier.

4. The method of claim 3 wherein the diffusion barrier comprises titanium.

5. The method of claim 2 wherein forming a first conductive layer comprises sputtering copper.

6. The method of claim 2 wherein forming a second conductive layer comprises forming a nickel layer over the copper and forming a gold layer over the nickel layer.

7. The method of claim 2 wherein the copper seed layer has a thickness in the range of approximately 120 to 180 nm.

8. The method of claim 7 wherein the copper seed layer has a thickness of approximately 150 nm.

9. The method claim 2 wherein forming a dielectric mask comprises using a lithography mask and wherein forming a resist mask comprises the same lithography mask.

10. The method of claim 9 wherein widening the openings comprises using a second lithography mask.

11. The method of claim 1 wherein the electronic component comprises a semiconductor component.

12. The method of claim 1 wherein the electronic component comprises a polymer component.

13. A method for fabricating metallic interconnects with copper-nickel-gold layer construction on an electronic component, the copper core of the interconnects being electrodeposited on a copper seed layer with a diffusion barrier arranged underneath and being covered by a nickel-gold layer by means of a resist mask, the method comprising:
   fabricating a dielectric mask on a surface of the component such that a mask structure encompasses the structure of the interconnects to be fabricated;
   applying a diffusion barrier and then a copper seed layer over the component, the diffusion barrier and copper seed layer overlying the mask structure;
   fabricating a resist mask on the copper seed layer by first lithographic patterning of the positive resist by means of a first lithography mask, the copper seed layer remaining free in the region of the interconnects to be fabricated;
   electrodepositing a copper core of the interconnects on the uncovered copper seed layer;
   patterning of the resist mask by means of a second lithography mask so that the mask openings of the resist mask that enclose the copper core of the interconnect are widened;
   applying a nickel-gold layer to the copper core;
   stripping the resist mask; and
   etching the diffusion barrier and the copper seed layer.

14. The method for fabricating metallic interconnects according to claim 13, wherein the copper seed layer has a thickness in the range of approximately 120 to 180 nm.

15. The method for fabricating metallic interconnects according to claim 14, wherein the copper seed layer has a thickness of approximately 150 nm.

16. The method for fabricating metallic interconnects according to claim 13, wherein the dielectric mask and the resist mask are patterned lithographically using the same lithography mask.

17. The method for fabricating metallic interconnects according to claim 13, wherein the diffusion barrier comprises titanium.

18. The method for fabricating metallic interconnects according to claim 13, wherein applying a diffusion barrier and then a copper seed layer comprises sputtering the diffusion barrier and then sputtering the copper seed layer.

19. The method for fabricating metallic interconnects according to claim 13, wherein the electronic component comprises a semiconductor component.

20. The method for fabricating metallic interconnects according to claim 13, wherein the electronic component comprises a polymer component.

* * * * *